(12) United States Patent
Jung et al.

(10) Patent No.: US 6,426,897 B1
(45) Date of Patent: Jul. 30, 2002

(54) METHOD OF ERASING A FLASH MEMORY DEVICE

(75) Inventors: Sung Mun Jung; Hee Gee Lee; Soo Min Cho, all of Kyungki-Do (KR)

(73) Assignee: Hyundai Electronics Industries Co., Ltd., Ichon (KR)

(*) Notice: Subject to any disclaimer, the term of this patent is extended or adjusted under 35 U.S.C. 154(b) by 0 days.

(21) Appl. No.: 09/721,936

(22) Filed: Nov. 27, 2000

(30) Foreign Application Priority Data

Dec. 28, 1999 (KR) .............................................. 99-64010

(51) Int. Cl.[7] .............................................. G11C 16/04

(52) U.S. Cl. ........................... 365/185.29; 365/185.27; 365/185.26; 365/185.33

(58) Field of Search ........................ 365/185.29, 185.27, 365/185.26, 185.33, 185.18, 218, 185.15

(56) References Cited

U.S. PATENT DOCUMENTS 5,357,476 A * 10/1994 Kuo et al. .................. 365/218
6,026,025 A * 2/2000 Chan et al. ............... 365/185.3

FOREIGN PATENT DOCUMENTS

JP           411220045 A   * 11/1998   ........... G11C/16/02

* cited by examiner

*Primary Examiner*—David Nelms
*Assistant Examiner*—David Lam
(74) *Attorney, Agent, or Firm*—Finnegan, Henderson, Farabow, Garrett & Dunner, L.L.P.

(57) ABSTRACT

A method of erasing a flash memory device performs erase operation by hot carrier injection method, by applying a ground potential to a source and applying the bias from a high voltage to a low voltage step by step, with a voltage of 5V being applied to a drain, wherein the bias of a floating gate in the flash memory device keeps 1.8 through 2V. being hot carrier injection condition and wherein the gate bias adjusts the bias applied according to the coupling ratio. Thus, it can reduce the erase time and allows the erase on a byte basis.

3 Claims, 3 Drawing Sheets

METHOD OF ERASING A FLASH MEMORY DEVICE

BACKGROUND OF THE INVENTION

1. Field of the Invention

The invention relates generally to a method of erasing a flash memory device. and more particularly to, a method of erasing a flash memory device by which erase operation is performed by hot carrier injection method, in such a manner that a ground potential is applied to the source and the bias from a high voltage to a low voltage is applied step by step to the gate. with a voltage of 5V being applied to the drain.

2. Description of the Prior Art:

Generally, the flash memory device performs a program operation by storing electrons in the floating gate using hot carrier injection method and also performs an erase operation by ejecting the electrons stored in the floating gate into the source or the bulk using F-N tunneling method.

The conventional method of programming the flash memory-device includes applying a positive voltage of about 10V to the gate terminal, applying a voltage of about 5V to the drain terminal and making the source terminal floating, as shown in FIG. 1. Due to this bias. the electrons of the source are injected into the floating gate by hot carrier injection, so that program operation can be performed. The program method using the above-mentioned hot carrier injection method consumes about 7 μs time to program one (1) byte.

As can be seen from the schematic view of the cell shown in FIG. 2. the conventional method of erasing the flash memory device includes applying a high negative voltage of about −9V to the gate terminal, making the source terminal and the drain terminal floating and applying a positive voltage of about 9V to the substrate. Due to this bias, the electrons stored in the floating gate are ejected into the source or the bulk by F-N tunneling. so that erase operation can be performed.

However, the erase method using the above-mentioned F-N tunneling method has a disadvantage that it consumes as long as about 1 second to erase one (1) sector. Also, in order to change a specific bit of data from "0" state to "1" state, there is a problem that a specific bit has to be again programmed with "0" state after 512 K cells are all erased with "1" state. That is a lot of time is required in mounting the device since the erase could not performed on a byte basis.

SUMMARY OF THE INVENTION

It is therefore an object of the present invention to provide a method of erasing a flash memory device by which erase operation can be performed on a byte basis using hot carrier injection method.

In order to accomplish the above object, a method of erasing a flash memory device is characterized in that erase is performed by hot carrier injection method, by applying a ground potential to a source and applying the bias from a high voltage to a low voltage step by step, with a first voltage being applied to a drain, wherein the bias of a floating gate in the flash memory device keeps a second voltage through a third voltage, which is the hot carrier injection condition and wherein the gate bias adjusts the bias applied according to the coupling ratio.

BRIEF DESCRIPTION OF THE DRAWINGS

The aforementioned aspects and other features of the present invention will be explained in the following description, taken in conjunction with the accompanying drawings wherein.

DETAILED DESCRIPTION OF PREFERRED EMBODIMENTS

The present invention will be described in detail by way of a preferred embodiment with reference to accompanying drawings.

Figure 3:
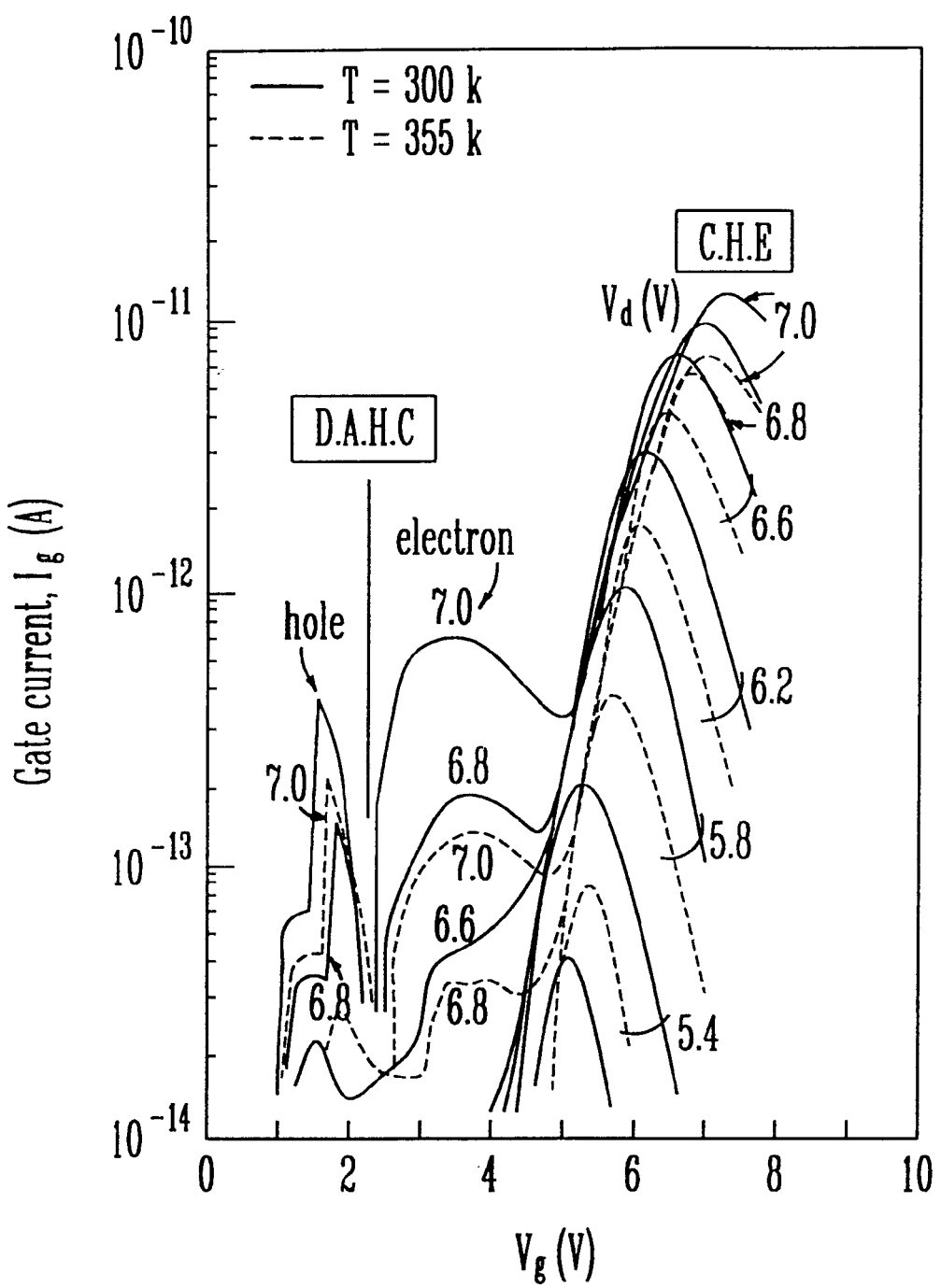
FIG. 3 is a graph the relationship between the gate bias and the sate current depending on the drain bias.

Referring now to FIG. 3, there is shown a graph the relationship between fie gate bias and the gate current depending on the drain bias, for explaining the principle of the present invention.

The graph shows an example in which the gate of the general transistor not the flash memory device is applied. As shown, the channel hot electrons (C.H.E) is generated when the gate voltage and the drain voltage are same drain avalanche hot electrons (indicated by electrons) are generated when the gate voltage is 3~4 V regardless of the drain bias and drain avalanche hot holes (indicated by holes) are generated when the Rate voltage is 1.8V regardless of the drain bias.

Therefore, in order to inject hot holes into the floating gate of the flash memory device according to the present invention, the above-mentioned floating ate voltage must be maintained at about 1.8~2.0V.

Figure 1:
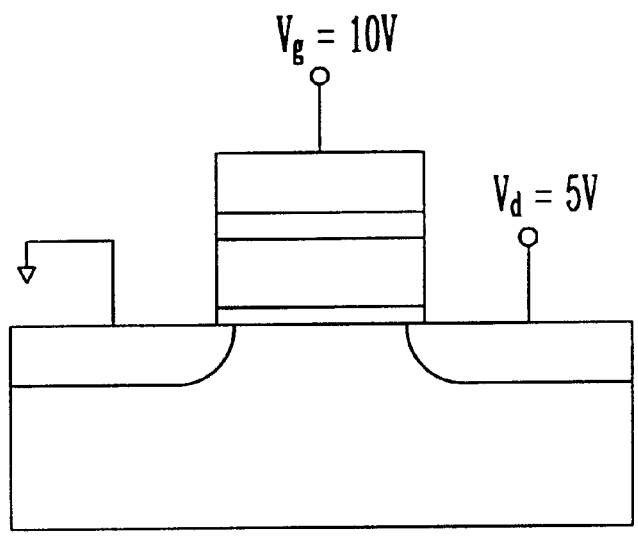
FIG. 1 is a schematic view of a cell for explaining a method of programming a conventional flash memory device.
Figure 2:
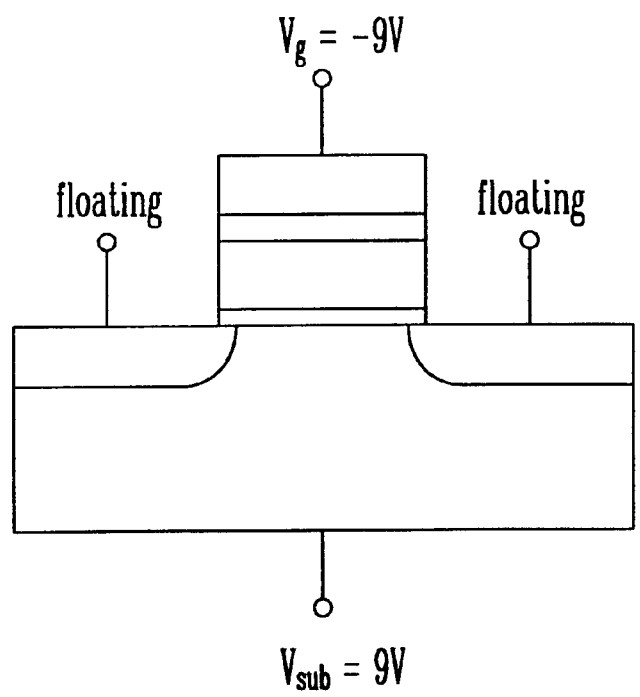
FIG. 2 is a schematic view of a cell for explaining a method of erasing a conventional flash memory device.

In order to apply the above-mentioned principle to the program method of the flash memory device, FIG. 1 will be referred to again.

The flash memory device is programmed by hot carrier injection method. In order to perform the program operation by injecting hot electrons, the gate bias and the drain bias must be same. However, the method of driving the flash memory device is determined by the floating gate bias. As such, the floating gate bias depends on the coupling ratio of the cell.

For example, assume that the coupling ratio of the cell is 0.55. At this time, as the gate bias for performing the program is 10V and the drain bias is 5V, the floating gate bias is equal to the gate bias x the coupling ratio, that is, about 5V. Therefore, as the floating gate bias and the drain bias are same, hot electrons are injected into the floating gate. At this time, if completely programmed, the floating gate bias is about −2V.

Figure 4A:
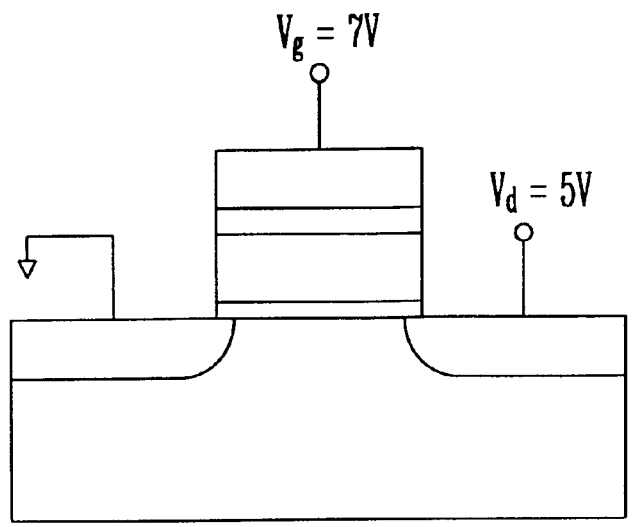
FIGS. 4A through 4C are schematic views of a cell for sequentially illustrating a method of erasing a flash memory device according to the present invention.
Figure 4B:
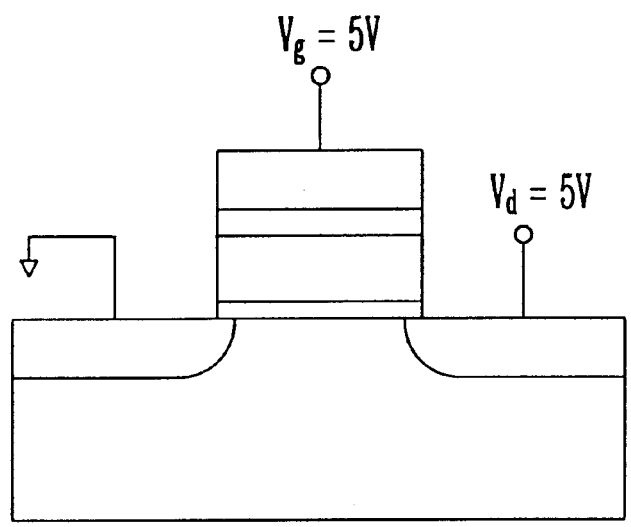
Figure 4C:
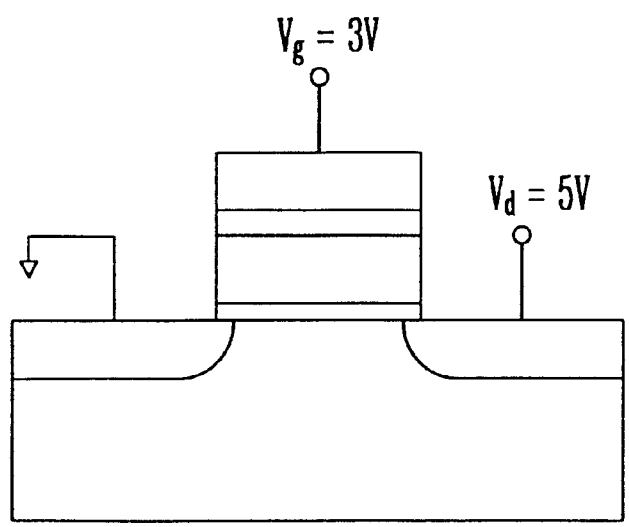

FIGS. 4A through 4C are schematic views of a cell for sequentially illustrating a method of erasing a flash memory device according to the present invention, by sequentially reducing and applying the gate bias.

Referring to FIG. 4A, assume that the coupling ratio of the cell is 0.55. If a voltage of 7V is applied to the gate and the bias of 5V is applied to the drain with the source being applied to the ground potential, the floating gate bias becomes 3.85V. Then, as the initial state is a program state, in consideration of the voltage of −2V that was accumulated in the floating gate, the floating gate bias becomes 1.85V. This falls within the condition in which hot carriers can be generated and the hot holes are thus injected into the floating gate, resulting in the erase state, as shown in FIG. 3.

However, the potential of the floating gate becomes higher as the hot holes are injected and thus the gate bias must be adjusted accordingly. In other words, during the erase operation, the gate bias of lowered 5V and 3V must be applied respectively, as shown in FIGS. 4B and 4C.

Referring now to FIG. 4B, it can be seen that the gate bias of lowered 5V is applied. Thus, the floating gate bias becomes 2.75V. However, as the potential of the floating gate increases from −2V to 0.9V, considering this, the floating gate bias becomes 1.85V.

Referring to FIG. 4C, it can be seen that the gate bias of lowered 3V is applied. Thus, the floating gate bias becomes 1.65V. However, as the potential of the floating gate is increased to 0.2V, considering this, the floating gate bias becomes 1.85V, As mentioned above, a method of erasing a flash memory device according to the present invention includes applying the bias of about 1.8~2V to the floating gate, which is the hot carrier injection condition. This means that the bias applied to the gate can be varied according to the coupling ratio of the cell.

As mentioned above, a method of erasing a flash memory device according to the present invention employs hot hole injection method not F-N tunneling method. thus reducing the erase time and allowing the erase on a byte basis.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of erasing a flash memory device is characterized in that erase is performed by hot carrier injection method comprising:

applying a ground potential to a source;

applying a bias from a high voltage to a low voltage step by step to a gate;

maintaining a selected gate voltage range; and applying a first voltage to a drain.

2. The method of erasing a flash memory device according to claim 1, wherein the bias of the gate keeps a second voltage through a third voltage, which is hot carrier injection condition.

3. The method of erasing a flash memory device according to claim 1, wherein said gate bias adjusts the bias applied according to a coupling ratio.

* * * * *